United States Patent [19]

Ouchi et al.

[11] Patent Number: 4,816,890
[45] Date of Patent: Mar. 28, 1989

[54] OPTOELECTRONIC DEVICE

[75] Inventors: Hirobumi Ouchi, Hino; Ichiro Fujiwara, Kawasaki; Hiroshi Matsuda, Hachioji; Kazuhiro Ito, Nishitama; Kazuyuki Nagatsuma, Hachioji, all of Japan

[73] Assignee: Hitachi, Ltd., Tokyo, Japan

[21] Appl. No.: 915,410

[22] Filed: Oct. 6, 1986

[30] Foreign Application Priority Data

Oct. 9, 1985 [JP] Japan .................. 60-223708

[51] Int. Cl.$^4$ .................. H01L 27/14; H01L 31/00
[52] U.S. Cl. .................. 357/30; 357/13; 357/16
[58] Field of Search .............. 357/30 A, 30 D, 30 E, 357/30 F, 30 R, 13, 16, 17, 52; 372/45

[56] References Cited

PUBLICATIONS

Donnelly et al., "Planar Guarded Avalanche Diodes in InP Fabricated by Ion Implantation", Appl. Phys. Lett. 35(1), Jul. 1, 1979, pp. 74-76.

*Primary Examiner*—WIlliam L. Sikes
*Assistant Examiner*—Georgia Y. Epps
*Attorney, Agent, or Firm*—Antonelli, Terry & Wands

[57] ABSTRACT

An avalanche photodiode including a substrate, a first semiconductor region of a first conductivity type having a relatively large band gap, a second semiconductor region of a second conductivity type having a relatively large band gap, and a third semiconductor region of the first conductivity type having a band gap smaller than the band gap of the first and second semiconductor regions, is disclosed in which, in order to suppress an increase in dark current and to cause the avalanche photodiode to operate on a low voltage, a fourth semiconductor region equal in conductivity type to and larger in impurity concentration than the first semiconductor region is formed in the first semiconductor region at a position below a central portion of a pn junction formed between the first semiconductor region and the second semiconductor region. The avalanche photodiode formed with this structure has low-noise and low operation voltage characteristics.

15 Claims, 3 Drawing Sheets

OPTOELECTRONIC DEVICE

BACKGROUND OF THE INVENTION

The present invention relates to optoelectronic devices for detecting or emitting light, such as an avalanche photodiode, other photodiodes which are used as photodetectors in fiber-optical communication, and a laser diode.

In order to lower the noise level of an avalanche photodiode type, and to increase the operation speed of the avalanche photodiode, an avalanche photodiode made of compound semiconductor materials has been developed. In this avalanche photodiode, incident light is absorbed by a semiconductor region having a relatively small band gap, and a photocurrent thus obtained is amplified on the basis of the avalanche multiplication phenomenon in another semiconductor region having a band gap larger than the band gap of the light absorbing region. Semiconductor materials such as an InP compound and a GaSb compound are used for making the above avalanche photodiode. Further, in order to improve the performance of the above avalanche photodiode, a guard ring region for preventing the avalanche breakdown on the periphery of a pn junction is formed in the avalanche photodiode, and means for suppressing the carrier accumulcation effect based upon the difference in energy gap between the light absorbing region and the avalanche multiplication region to increase the operation speed of the avalanche photodiode is provided therein, that is, the region 4 of FIG. 6 having a band gap which is intermediate between the band gap of the light absorbing region and that of the avalanche multiplication region, is interposed between these regions.

However, in a compound semiconductor which has a small band gap and a small effective electron mass, there arises the following problem. That is, when a strong electric field is applied in the compound semiconductor, breakdown due to the tunneling effect is apt to occur before the avalanche breakdown is generated. Accordingly, when a reverse bias voltage applied across an avalanche photodiode with the SAM structure (namely, the separated absorption and multiplication structure) is increased so that a strong electric field extending from a pn junction which is formed in a semiconductor region having a large band gap (namely, the region 5 of FIG. 6), is applied to a middle region (namely, the region 4 of FIG. 6) or light absorbing region (namely, the region 3 of FIG. 6) having a small band gap, a dark current is increased by the field emission due to the tunnel effect. In order to prevent such an increase in dark current, the impurity concentration of that portion of the semiconductor region having the large band gap (namely, the region 5 of FIG. 6) which exists at a portion between the pn junction and the middle region or light absorbing region, has been made high, or the thickness of the above portion has been made large. However, when the impurity concentration of the above portion is made high, a maximum electric field intensity at the pn junction becomes large. Then the ratio k of the ionization coefficient of hole $\beta$ to that of electron $\alpha$, $k = \alpha/\beta$, is decreased. Here, the ionization coefficient means the number of electron-hole pairs when one hole (or electron) transits a unit length. As a result, the avalanche magnification noise is increased (the noise of the avalanche photodiode is low when the ratio k is high). When the thickness of the above portion is made large, the operating voltage applied across the avalanche photodiode becomes high. Such a high operating voltage is undesirable from a practical point of view.

SUMMARY OF THE INVENTION

It is an object of the present invention to provide an avalanche photodiode which can prevent an increase in dark current caused by a tunneling current as well as one which, is low in noise, and which has a low operating voltage.

According to the present invention, there is provided an optoelectronic device including a first semiconductor region of a first conductivity type having a relatively large band gap, a second region of a second conductivity type having a relatively large band gap and a third semiconductor region of the first conductivity type having a band gap smaller than the band gap of the first and second semiconductor regions, in which device a pn junction is formed between the first semiconductor region and the second semiconductor region, and a portion of the first semiconductor region is made larger in impurity concentration than the remaining portion of the first semiconductor region, to form a fourth semiconductor region. For example, in an avalanche photodiode shown in FIG. 1, a pn junction 26 is formed between a second semiconductor region 16 and a first semiconductor region 15 which has a large band gap and a small impurity concentration to serve as an avalanche multiplication region, and a fourth semiconductor region 25 which is larger in impurity concentration than the first semiconductor region and has the large band gap, is formed in the first semiconductor region so that the fourth semiconductor region exists only under a central portion of the pn junction and lies in proximity to or comes in contact with a middle semiconductor region 14.

As is apparent from FIG. 2 which shows the electric field intensity distribution in the avalanche photodiode of FIG. 1, a strong electric field required for the avalanche magnification is limited to that portion of the first semiconductor region 15 which exists between the fourth semiconductor region 25 and the pn junction 26. The above portion will hereinafter be referred to as a main junction or avalanche portion.

As shown in FIG. 2, the intensity of electric field is greatly decreased at the fourth semiconductor region 25. Thus, a weak electric field is applied in the third semiconductor region 13 (serving as a light absorbing region), in the middle semiconductor region 14 and in that portion of the first semiconductor region which exists between the fourth semiconductor region 25 and the middle semiconductor region 14. That is, the electric field intensity in the semiconductor regions 13 and 14 which are smaller in band gap than the first semiconductor region and thus are apt to produce the tunneling effect, is kept at a level necessary for carriers to obtain a saturated drift velocity, and hence an increase in dark current caused by a tunneling current will not occur. It should be noted that the fourth semiconductor region 25 is absent under the peripheral portion of the pn junction 26. That is, only the first semiconductor region 15 having a low impurity concentration exists between the peripheral portion of the pn junction and the middle semiconductor region. Accordingly, a maximum electric field in that portion of the first semiconductor region which exists below the peripheral portion of the pn junction, will be smaller than a maximum electric field in the avalanche portion, and thus the above portion of the first semiconductor region can have a guard ring effect. Hence, this portion will hereinafter be referred to as a guard ring portion. The above guard ring effect can be explained as follows. Referring to FIG. 2, the area bounded by the intensity distribution curve along the line A—A' and the X-axis (namely, abscissa) will be equal to the area bounded by the intensity distribution curve along the line B—B' and the X-axis, for a reverse bias voltage applied across the avalanche photodiode. Thus, as shown in FIG. 2, the electric field is weak throughout the guard ring portion. Therefore, the guard ring portion can act effectively as a guard ring, and the avalanche photodiode can exhibit stable avalanche magnification characteristics.

The avalanche multiplication phenomenon at the avalanche portion is governed mainly by the distance between the pn junction 26 and the fourth semiconductor region 25, since the first semiconductor region has a low impurity concentration. Accordingly, the operating voltage of the avalanche photodiode of FIG. 1 is stable without being affected by variations in impurity concentration at the first semiconductor region.

Further, in the avalanche photodiode of FIG. 1, the middle semiconductor region 14 having an intermediate band gap is interposed between the first semiconductor region 15 and the light absorbing region 13 to lower the barrier for photo-excited carriers caused by the difference in band gap between the regions 15 and 13. Accordingly, the photo-excited carriers generated in the light absorbing region 13 are rapidly injected into the first semiconductor region 15 serving as the avalanche multiplication region, and hence the photoresponse time of the avalanche photodiode is fast.

Another avalanche photodiode according to the present invention is shown in FIG. 3. The avalanche photodiode of FIG. 3 is basically identical with that of FIG. 1, except that a semiconductor region 47 is additionally provided. The semiconductor region 47 and a first semiconductor region 35 which serves as the avalanche multiplication region, are made of the same semiconductor material having a relatively large band gap, but the region 47 is larger in impurity concentration than the first region 35. Accordingly, the electric field extending from the avalanche portion to a light absorbing region 33 is weakened by a fourth semiconductor region 45, and is further weakened by the region 47. Thus, the electric field formed in the light absorbing region (namely, the third semiconductor region) 33 having a relatively small band gap and a middle semiconductor region 34 having an intermediate band gap, is weakened to a level necessary for carriers to obtain a saturated drift velocity. While, the electric field extending from the guard ring portion to the light absorbing region is weakened at the semiconductor region 47, and thus the electric field formed in the light absorbing region 33 and the middle semiconductor region 34 has a small intensity as in the case of the avalanche portion. In other words, the voltage applied across the light absorbing region 33 and the middle semiconductor region 34 is reduced by an amount corresponding to a voltage drop across the semiconductor region 47, and thus the electric field in the light absorbing region 33 and the middle semiconductor region 34 which are smaller in band gap than the first semiconductor region 35, is weakened by the region 47. Further, a strong electric field is formed in the avalanche portion which exists between a central portion of a pn junction 46 and the fourth semiconductor region 45. While, the guard ring portion lying under a peripheral portion of the pn junction 46 does not include the fourth semiconductor region 45. Accordingly, the guard ring portion is larger in thickness of the first semiconductor region than the avalanche portion, and hence the electric field in the guard ring portion is weaker than that in the avalanche portion, as in the avalanche photodiode of FIG. 1.

As mentioned above, according to the present invention, there is provided an avalanche photodiode including a first semiconductor region of a first conductivity type having a relatively large band gap, a second semiconductor region of a second conductivity type having a relatively large band gap and a third semiconductor region of the first conductivity type having a band gap smaller than the band gap of the first and second semiconductor regions, in which avalanche photodiode a pn junction is formed between the first semiconductor region and the second semiconductor region, and a fourth semiconductor region equal in conductivity type to and larger in impurity concentration than the first semiconductor region is formed in the first semiconductor region. In the avalanche photodiode having the above structure, the electric field at the pn junction is weakened due to the existence of the fourth region having a high impurity concentration, and thus the intensity of the electric field formed in the third semiconductor region which has a small band gap and serves as a light absorbing region, is small. Accordingly, an increase in dark current caused by a tunneling current can be prevented. Further, the guard ring portion is larger in thickness of the first semiconductor region than the avalanche portion, and the first semiconductor region has a low impurity concentration. Accordingly, the electric field formed in the guard ring portion is weaker than that formed in the avalanche portion, and hence the breakdown on the periphery of the pn junction can be prevented. Thus, stable avalanche multiplication is carried out. Further, the avalanche portion has a low impurity concentration and a large band gap, and hence the avalanche multiplication phenomenon is governed mainly by the thickness of the avalanche portion. Accordingly, uniform multiplication can be made without being affected by variations in impurity concentration at the avalanche portion.

DESCRIPTION OF THE PREFERRED EMBODIMENTS

EMBODIMENT I

Figure 1:
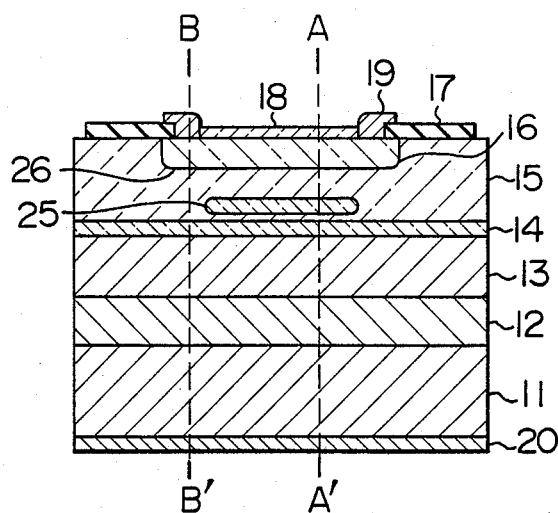
FIG. 1 is a cross-sectional view showing a first embodiment of an optoelectronic device according to the present invention.
Figure 2:
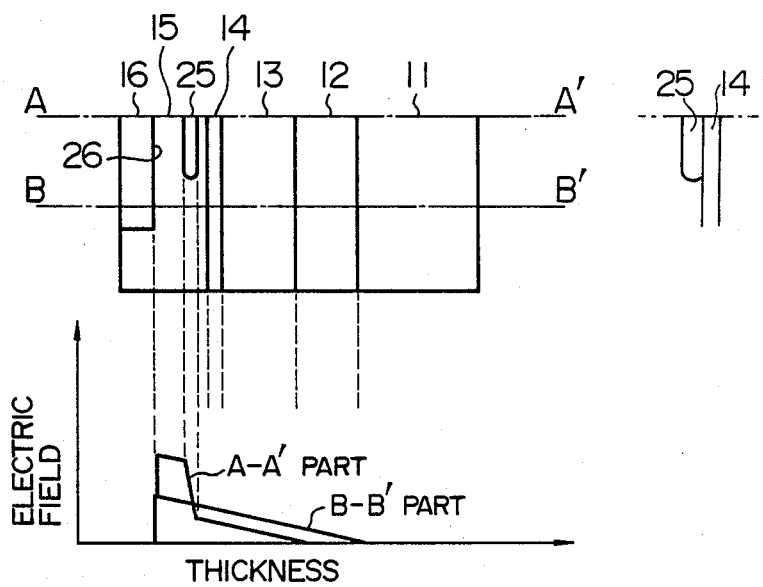
FIG. 2 is a diagram showing the electric field intensity distribution in the first embodiment of FIG. 1.

FIG. 1 shows a first embodiment of an optoelectronic device according to the present invention, and FIG. 2 shows the electric field intensity distribution in the first embodiment. Now, explanation will be made for a case where the first embodiment is made of compound semiconductor materials including InP. Referring to FIG. 1, an n-InP layer 12 having an impurity concentration of $2 \times 10^{15}$ cm$^{-3}$ and a thickness of 2.5 μm is formed on a highly-doped, n+-InP substrate 11 through vapor phase epitaxial growth techniques. Then, an n-InGaAs layer 13 having an impurity concentration of $2 \times 10^{15}$ cm$^{-3}$ and a thickness of 3 μm is grown on the InP layer 12, to be used as a light absorbing region, and an n-InGaAsP layer 14 having an impurity concentration of $2 \times 10^{15}$ cm$^{-3}$ and a thickness of 0.3 μm is grown on the InGaAs layer 13, to be used as a middle semiconductor region. The band gap of InGaAsP is intermediate between the band gap of InP and that of InGaAs, and corresponds to an optical wavelength of 1.3 μm. Further, an n-InP layer 15 having an impurity concentration of $2 \times 10^{15}$ cm$^{-3}$ and a thickness of 4 μm is grown on the InGaAsP layer 14, to be used as a first semiconductor region. The substrate 11 and the layers 12 to 15 make up the pellet of the first embodiment. Then, high-energy silicon ions are implanted into the InP layer 15 through selective ion implantation techniques so that the silicon concentration becomes maximum at a position which has a depth of 3 μm from the surface of the layer 15, and a maximum silicon concentration becomes equal to $3 \times 10^{16}$ cm$^{-3}$, to form a fourth semiconductor region 25. The n-type fourth semiconductor region 25 may be formed through techniques other than ion implantation techniques. That is, in the course of the growth of the first semiconductor region 15, this crystal growth is interrupted, and silicon is diffused in the grown layer through selective diffusion techniques. Then, the crystal growth of the first semiconductor region 15 is again started, to complete the first semiconductor region 15. The impurity concentration N and the thickness d of the fourth semiconductor region 25 are determined, depending upon how much the electric field intensity is to be reduced by the fourth semiconductor region 25, and a reduction in electric field intensity caused by the fourth semiconductor region 25 is given by qNd/E, where q indicates the electronic charge, and E a dielectric constant. What is material for the fourth region 25 is that it sufficiently raises the average electric field intensity in that portion of the region 15 sandwiched between the junction 26 and the fourth region 25. In other words, the electric field intensity keeps a high value from the junction to the fourth region, but becomes sufficiently low in the region 13. Thus, it will be apparent that the fourth region 25 may be formed to touch the region 14 as shown in righthand part of FIG. 2. Next, a p-type layer 16 serving as a second semiconductor region is formed in the first semiconductor region 15 through ion implantation or diffusion techniques. Thereafter, a two-layer film 17 which includes an SiN$_x$ layer by plasma deposition and an SiO$_2$ layer by chemical vapor deposition, is formed, as a passivation film, on the first and second semiconductor regions 15 and 16, and then an undesired portion of the two-layer film 17 is removed through the well-known photoetching techniques. An SiN$_x$ film 18 is formed, as an antireflection film, on a desired surface area, and electrodes 19 and 20 are formed on the second semiconductor region 16 and the substrate 11 through the well-known evaporation techniques so that the electrodes 19 and 20 are kept in ohmic contact with the second semiconductor region 16 and the substrate 11, respectively.

Now, explanation will be made of the operation of the first embodiment which is fabricated in the above-mentioned manner. Incident light within a wavelength range from 1 to 1.6 μm passes through the first semiconductor region 15 and the fourth semiconductor region 25, and is then absorbed by one or both of the middle semiconductor region 14 and the InGaAs layer 13. Since a reverse bias voltage is applied between the electrodes 19 and 20, the InGaAs layer 13 and the middle semiconductor region 14 become a depletion layer. Accordingly, photo-excited carriers are moved, at a drift velocity, to the avalanche portion which is applied with a strong electric field sufficient to generate avalanche multiplication. The carriers injected into the avalanche portion cause the avalanche multiplication, and thus an amplified photocurrent flows through an external circuit connected between the electrodes 19 and 20.

EMBODIMENT II

Figure 3:
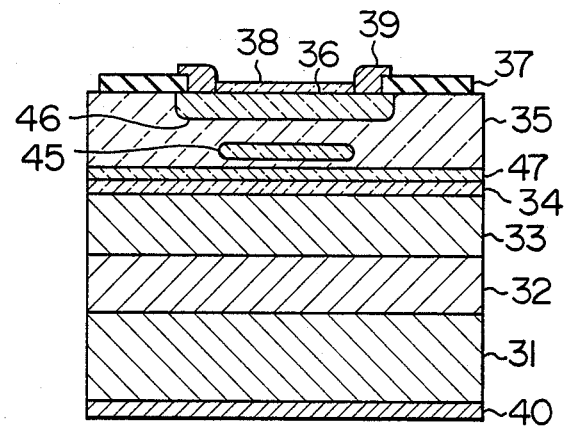
FIG. 3 is a cross-sectional view showing a second embodiment of an optoelectronic device according to the present invention.

FIG. 3 shows a second embodiment of an optoelectronic device according to the present invention. Referring to FIG. 3, an n-InP layer 32, an n-InGaAs layer 33, an n-InGaAsP layer 34, an n-InP layer 47 and an n-InP layer 35 are successively grown through vapor phase growth techniques, to form a desired crystal on a substrate 31. The layers 32, 33, 34 and 35 correspond to the layers 12, 13, 14 and 15 of the first embodiment, respectively. The n-InP layer 47 which is not included in the first embodiment, has an impurity concentration of $2 \times 10^{16}$ cm$^{-3}$ and a thickness of 0.4 μm. A fourth semiconductor region 45 and a second semiconductor region 36 are both formed through ion implantation techniques. The second embodiment having the above structure can operate in substantially the same manner as the first embodiment.

In the above, explanation has been made on a case where each of the first and second embodiments is made of compound semiconductor materials including InP. However, the present invention is not limited to such semiconductor materials, but it is possible to make the light absorbing region 13 or 33 of GaSb and to make the first, second, fourth and middle semiconductor regions of composition controlled GaAlSbAs, since the band gap of GaSb is smaller than that of GaAlSbAs. Further, the first semiconductor region 13 or 33 may be made of InAlAs or silicon, instead of InP. As mentioned above, various combinations of semiconductor materials can be used for making each of the first and second embodiments.

EMBODIMENT III

Figure 4:
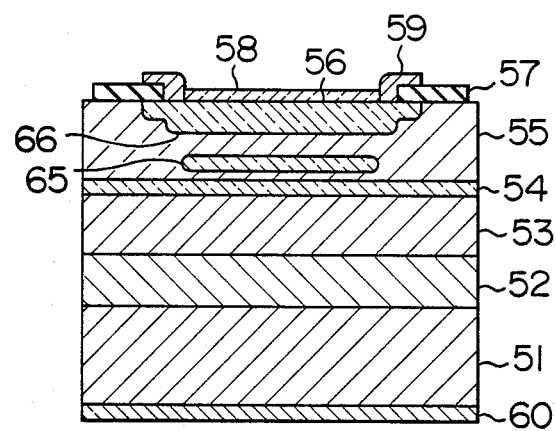
FIGS. 4 and 5 are cross-sectional views showing third embodiment of the optoelectronic device according to the present invention.
Figure 5:
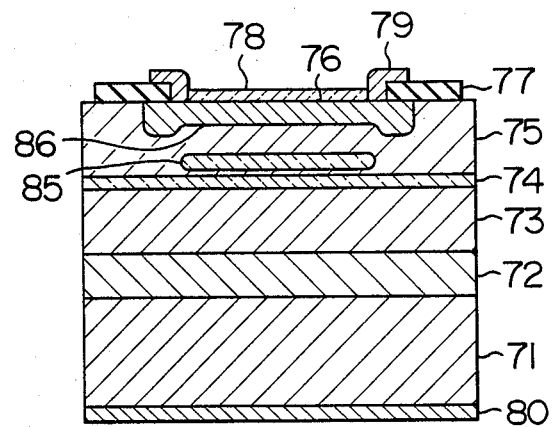
Figure 6:
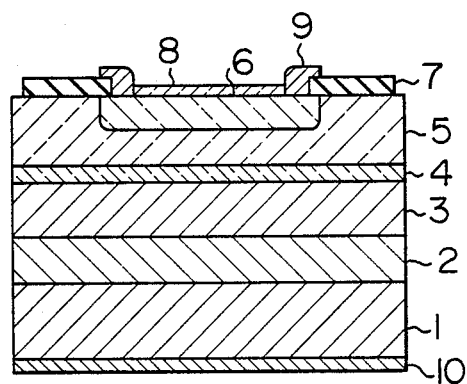
FIG. 6 is a cross-sectional view showing an example of a conventional optoelectronic device.

In the first and second embodiments, the peripheral portion of the pn junction 26 or 46 can produce a guard ring effect by forming the fourth semiconductor region 25 or 45 only under the central portion of the pn junction. FIGS. 4 and 5 show a third embodiment of the optoelectronic device according to the present invention. In the embodiment of FIGS. 4 and 5, a graded junction having a low impurity concentration is formed on the periphery of a second semiconductor region 56 or 76, to enhance the guard ring effect. It is needless to say that, like the first and second embodiments, the third embodiment of FIGS. 4 and 5 have the characteristic features of the present invention.

The embodiments of FIGS. 1, 3, 4 and 5 are concerned with an avalanche photodiode. However, the technical thought of the present invention is not limited to the avalanche photodiode, but is applicable to other optoelectronic devices such as a photodiode and a laser diode.

We claim:

1. In an optoelectric device, a semiconductor body which contains a pn junction formed therein, said semiconductor body including a substrate, a first semiconductor layer of a first conductivity type having a relatively large band gap, a second semiconductor layer of a second conductivity type having a relatively large band gap, and a third semiconductor layer of said first conductivity type having a band gap smaller than the band gap of the first and second semiconductor layers, wherein the pn junction is formed between said first semiconductor layer and said second semiconductor layer, wherein said first, second and third semiconductor layers are formed over said substrate with said third semiconductor layer disposed on a side of the first semiconductor layer remote from said second semiconductor layer, and wherein said first semiconductor layer includes a fourth semiconductor layer which has a larger impurity concentration than the remaining portion of said first semiconductor layer and which is separated from said second and third semiconductor layers.

2. In an optoelectronic device according to claim 1, wherein said fourth semiconductor layer exists only under a central portion of said pn junction.

3. In an optoelectronic device according to claim 1, wherein said first semiconductor layer is made of InP.

4. In an optoelectronic device according to claim 1, wherein said first semiconductor layer is made of one of InAlAs and silicon.

5. In an optoelectronic device according to claim 1, wherein an avalanche photodiode is formed of said optoelectronic device.

6. In an optoelectronic device according to claim 1, wherein a photodiode is formed of said optoelectronic device.

7. In an optoelectronic device according to claim 1, wherein said third semiconductor layer is formed over said substrate, said first semiconductor layer is formed over said third semiconductor layer and said second semiconductor layer is formed over said first semiconductor layer.

8. In an optoelectronic device according to claim 7, further comprising a pair of electrodes for applying an electric potential across the pn junction, wherein one of said electrodes is coupled to said substrate and the other of said electrodes is coupled to said second semiconductor layer.

9. In an optoelectrical device, a structure comprising:
a substrate; and
a plurality of semiconductor layers formed on said substrate,
wherein said semiconductor layers include a first semiconductor layer of a first conductivity type having a relatively large band gap, a second semiconductor layer of a second conductivity type opposite to the first conductivity type having a relatively large band gap and disposed adjacent to said first semiconductor layer to form a pn junction therebetween, a third semiconductor layer of said first conductive type having a band gap smaller than those of said first and second semiconductor layers, and a fourth semiconductor layer having an impurity concentration larger than that of said first semiconductor layer, wherein said first semiconductor layer is formed between said second and third semiconductor layers, and wherein said fourth semiconductor layer is formed within said first semiconductor layer and is separated from said second semiconductor layer.

10. In an optoelectronic device according to claim 9, wherein said third semiconductor layer is formed over said substrate, said first semiconductor layer is formed over said third semiconductor layer and said second semiconductor layer is formed over said first semiconductor layer.

11. In an optoelectronic device according to claim 10, further comprising a pair of electrodes for applying an electric potential across the pn junction, wherein one of said electrodes is coupled to said substrate and the other of said electrodes is coupled to said second semiconductor layer.

12. In an optoelectronic device according to claim 9, wherein said fourth semiconductor layer exists only under a central portion of said pn junction.

13. In an optoelectronic device according to claim 9, wherein said first semiconductor layer is made of InP.

14. In an optoelectronic device according to claim 9, wherein said first semiconductor layer is made of one of InAlAs and silicon.

15. In an optoelectronic device according to claim 9, wherein an avalanche photodiode is formed of said optoelectronic device.

* * * * *